United States Patent [19]

Bauer et al.

[11] Patent Number: 5,040,042
[45] Date of Patent: Aug. 13, 1991

[54] BIDIRECTIONAL SEMICONDUCTOR COMPONENT THAT CAN BE TURNED OFF

[75] Inventors: Friedhelm Bauer; Thomas Stockmeier, both of Würenlingen, Switzerland

[73] Assignee: ASEA Brown Boveri Ltd., Baden, Switzerland

[21] Appl. No.: 514,240

[22] Filed: Apr. 25, 1990

[30] Foreign Application Priority Data

Apr. 28, 1989 [CH] Switzerland ............ 1636/89

[51] Int. Cl.[5] ............................................ H01L 29/74
[52] U.S. Cl. ........................................ 357/38; 357/39; 357/23.4
[58] Field of Search ........................... 357/38, 39, 23.4

[56] References Cited

U.S. PATENT DOCUMENTS

| 4,199,774 | 4/1980 | Plummer . | |
|---|---|---|---|
| 4,623,910 | 11/1986 | Risberg | 357/38 |
| 4,811,072 | 3/1989 | Risberg | 357/38 |
| 4,816,892 | 3/1989 | Temple | 357/38 |
| 4,823,172 | 4/1989 | Mihara | 357/23.4 |
| 4,912,541 | 3/1990 | Baliga et al. | 357/38 |
| 4,914,496 | 4/1990 | Nakagawa et al. | 357/23.4 |

FOREIGN PATENT DOCUMENTS

| 0039941 | 11/1981 | European Pat. Off. . | |
|---|---|---|---|
| 0081642 | 6/1983 | European Pat. Off. . | |
| 0111804 | 6/1984 | European Pat. Off. . | |
| A0206350 | 12/1986 | European Pat. Off. | 357/38 |
| A0280535 | 8/1988 | European Pat. Off. | 357/23.4 |
| A0340445 | 11/1989 | European Pat. Off. | 357/38 |
| 3820677 | 1/1989 | Fed. Rep. of Germany | 357/38 |
| 63-73564 | 4/1988 | Japan | 357/23.4 |
| 63-209172 | 8/1988 | Japan | 357/38 |

OTHER PUBLICATIONS

Patent Abstracts of Japan, vol. 12, No. 498, (E-698)(3345), Dec. 26, 1988, T. Shinohe, "Insulated--Gate Self-Turn-Off Thyristor", & JP,A, 63209172, Aug. 30, 1988.

IEEE Transactions on Power Electronics, vol. 3, No. 2, Apr., 1988, pp. 105-117, T. A. Lipo, "Recent Progress in the Development of Solid-State AC Motor Drives".

IEEE Int. Electron Dev. Meet. Techn. Dig., 1982, pp. 264-267, B. J. Baliga et al., "The Insulated Gate Rectifier (IGR): A New Power Switching Device".

IEEE Transactions on Electron Devices, vol. ED-33, No. 10, Oct., 1986, pp. 1609-1618, V. A. K. Temple, "MOS-Controlled Thyristors—A New Class of Power Devices".

Primary Examiner—Rolf Hille
Assistant Examiner—Steven Loke
Attorney, Agent, or Firm—Oblon, Spivak, McClelland, Maier & Neustadt

[57] ABSTRACT

In the case of a symmetrically constructed TRIAC, which comprises a semiconductor substrate (20) with an internal n-base layer (9), two adjoining p-base layers (7, 11), two n-emitter regions (4, 12) let into the p-base layers (7, 11), two main electrodes (1, 17) arranged on the principal faces (29, 30), and two firing devices, a simplified control is achieved by means of MOS-controlled short circuits (3, 5, 6, 7 or 11, 13, 14, 16) at the n-emitter regions (4 or 12).

6 Claims, 3 Drawing Sheets

BIDIRECTIONAL SEMICONDUCTOR COMPONENT THAT CAN BE TURNED OFF

BACKGROUND OF THE INVENTION

1. Field of the Invention

The present invention relates to the field of power electronics, in particular it relates to a bidirectional semiconductor component that can be turned off comprising:

(a) a semiconductor substrate, which is bounded by two principal faces and has a plurality of differently doped layers between the principal faces;

(b) on the first principal face, a first main electrode belonging to a first main terminal;

(c) on the second principal face, a second main electrode belonging to a second main terminal;

(d) in the interior of the semi-conductor substrate, a first base layer;

(e) under the first main electrode a number of first emitter regions, which project from the first principal face into the semiconductor substrate and are contacted by the first main electrode;

(f) under the second main electrode a number of second emitter regions, which project from the second principal face into the semiconductor substrate and are contacted by the second main electrode;

(g) first short circuits, controlled by MOSFETs, which short circuit the first emitter regions; and (h) second short circuits, controlled by MOSFETs, which short circuit the second emitter regions.

Such a component is known, e.g. from EP-B1-0,111,804.

DISCUSSION OF BACKGROUND

Modern power semiconductor components must meet a range of requirements, in order, via the standardization of converter components, to enable a reduction in the design expenditure and production costs of industrial drivers (cf. in this connection: T. A. Lipo, IEEE Trans. Power Electronics, Vol. 3, No. 2 (1988), pages 105–117).

A wholly essential precondition for this is a simplification in the control of power semiconductors that can be turned off (e.g. GTO), such as one is accustomed to in the case of MOS power transistors in the low power range. On the other hand, the bipolar nature of the switch cannot be abandoned, since only in this way do the conducting-state power losses remain within a justifiable framework in the case of components for high voltages ($\geq 1$ kV).

Power semiconductors that combine bipolar conducting mechanisms with an MOS control were developed some time ago to solve this problem. The Insulated Gate Bipolar Transistor (IGBT), which was described by B. J. Baliga et al., IEEE Int. Electron Dev. Meet. Techn. Dig. (1982), pages 264–267 under the designation IGR (Isolated Gate Rectified), is a representative of this new class of BIMOS (BIpolar MOS) components which are already commercially available.

The IGBT (IGR) is just as simple to control as a power MOSFET, but with regard to the ON resistance for voltages greater than 500 V is clearly superior to the latter.

In the case of the IGBT, the base current of a bipolar structure is controlled via an integrated MOSFET. This renders possible modulation of the resistance of the base to a limited extent. It follows that the maximum possible blocking voltages for IGBTs are at present 1,000 V or slightly higher than that. Because of the large ON-resistance, it has not been possible to implement higher blocking voltages without encountering problems.

On the other hand, a candidate for higher voltages is a thyristor structure in which cathode short circuits can be switched via MOS gates. Such MOS controlled thyristors (MOS Controlled Thyristors=MCT) are described, for example, in the article by V. A. K. Temple, IEEE Trans. Electron Dev., ED-33 (1986), pages 1609–1618.

The MCT can be designed such that it can be turned on and off via a single MOS gate (through control with a positive or negative potential). On the other hand, this component has an asymmetric structure, so that it can conduct or block current in only one direction.

However, an essential precondition for implementing modern converter concepts (e.g. that of the matrix converters mentioned in the article by T. A. Lipo, is to have available a component with the capability of conducting and blocking bidirectionally.

A bidirectional IGR has already been described in detail in the EP-B1-0,111,804 mentioned at the beginning. However, as an IGR this known bidirectional component is subject to the same limitations with regard to the blocking voltage as the abovementioned unidirectional IGR.

SUMMARY OF THE INVENTION

Accordingly, one object of this invention is to provide a novel bidirectional semiconductor component that can be turned off, which, on the one hand, can be controlled with simple means and, on the other hand, can be designed for much higher blocking voltages.

This object is achieved in the case of a component of the type mentioned in the beginning in that (i) the first and second emitter regions have a doping of the same polarity as the first base layer;

(k) a second base layer doped with opposite polarity, into which the first emitter regions project, is arranged between the first base layer and the first emitter regions;

(l) a third base layer doped with opposite polarity, into which the second emitter regions project, is arranged between the first base layer and the second emitter regions;

(m) the second and third base layer is laterally bounded in such a way that the first base layer comes to the second principal face in the region of the second base layer and to the first principal face in the region of the third base layer; and (n) further emitters are arranged between the first base layer and the associated main electrode, which are doped with the same polarity as the second and third base layer, opposite the second and third base layer, in each case.

A first preferred illustrative embodiment is distinguished in that (a) the first base layer is an n-doped n-base layer;

(b) the first and second emitter regions are each $n^+$-doped n-emitter regions; and (c) the second and third base layer are each p-doped p-base layers.

That is to say, starting from the concept, known per se, of a TRIAC, the n-emitters on both sides of the component are equipped with emitter short circuits which can be turned on and off by means of MOSFETs.

Switching on these short circuits leads to the interruption of electron emission, and thus to the corresponding p-n-p-n structure being turned off.

Since the switchable short circuits are arranged on both sides of the component, the semiconductor switch can be switched off independently of the current direction obtaining at any one time.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
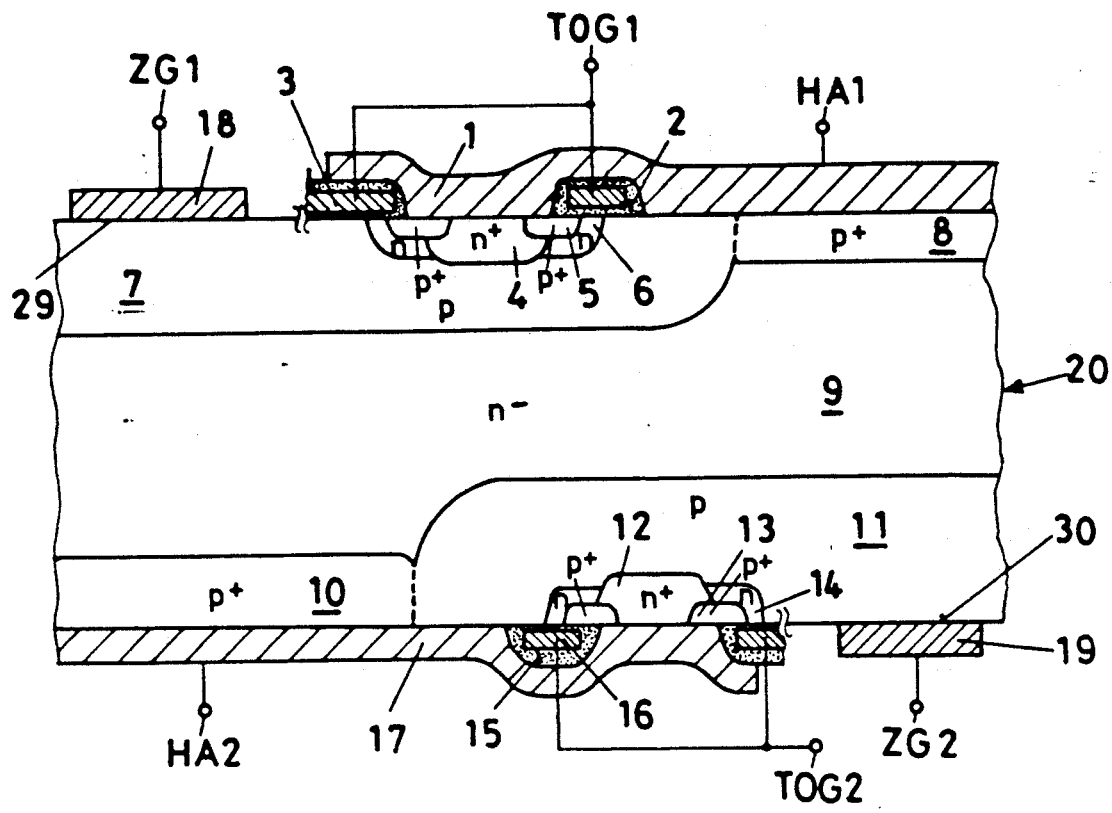
FIG. 1 shows a first illustrative embodiment for a component according to the invention with separate firing gates at the p-base layers.

Referring now to the drawings, wherein like reference numerals designate identical or corresponding parts throughout the several views, in FIG. 1 a first illustrative embodiment is represented for a component according to the invention.

A semiconductor substrate 20 (generally made of Si) contains between two parallel principal faces 29 and 30 a central, n⁻-doped n-base layer 9 which is adjoined above and below in each case by a p-doped p-base layer 7 and 11 respectively.

The p-base layers 7 and 11 are bounded laterally in such a way that the n-base layer 9 widens opposite the p-base layer 11 towards the first principal face 29 and opposite the p-base layer 7 towards the second principal face. In the widening regions, there are let into the n-base layer 9 from the respective principal face 29 or 30 a p⁺-doped p-emitter layer 8 opposite the p-base layer 11, and a p⁺-doped p-emitter layer 10 opposite the p-base layer 7.

Projecting into the p-base layer 7 or 11 from the surface are n⁺-doped n-emitter regions 4 or 12 respectively, which are equipped with MOS-controlled short circuits. Each of these short circuits comprises a p⁺-doped p-source region 5 or 13, a n-doped n-channel region 6 or 14, the p-base layer 7 or 11 and isolated gate electrodes 3 or 16.

The n-emitter regions 4 or 12 and the p-emitter layers 8 or 10 are contacted by a main electrode 1 or 17 which is applied as a metallic coating (e.g. made of Al) to the particular principal face 29 or 30, and are isolated electrically from the gate electrodes 3 or 16 located thereunder by gate insulations 2 or 15.

Special gate metallic coatings 18 or 19, which directly contact the p-base layer 7 or 11 located thereunder, are arranged next to the main electrodes 1 or 17 on the principal faces 29 or 30 for the purpose of firing.

Each gate metallic coating 18 or 19 is connected to a corresponding firing gate ZG1 or ZG2, each gate electrode 3 or 16 to a corresponding turn-off gate TOG1 or TOG2, and each main electrode 1 or 17 to a main terminal HA1 or HA2.

Figure 2:
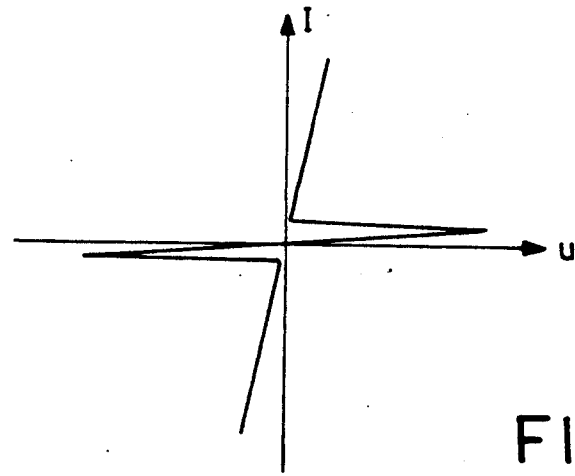
FIG. 2 shows the J-U-characteristic of a component in accordance with FIG. 1 (and FIG. 3)

The component in accordance with FIG. 1 can be fired in both directions by the conventional firing gates ZG1 or ZG2, and can be turned off by turning on the MOS-controlled short circuits at the n-emitter regions 4 or 12. For the current I via the voltage U of such a component, the result is then a characteristic in accordance with FIG. 2, which corresponds to the current-voltage characteristic of a conventional TRIAC.

Figure 3:
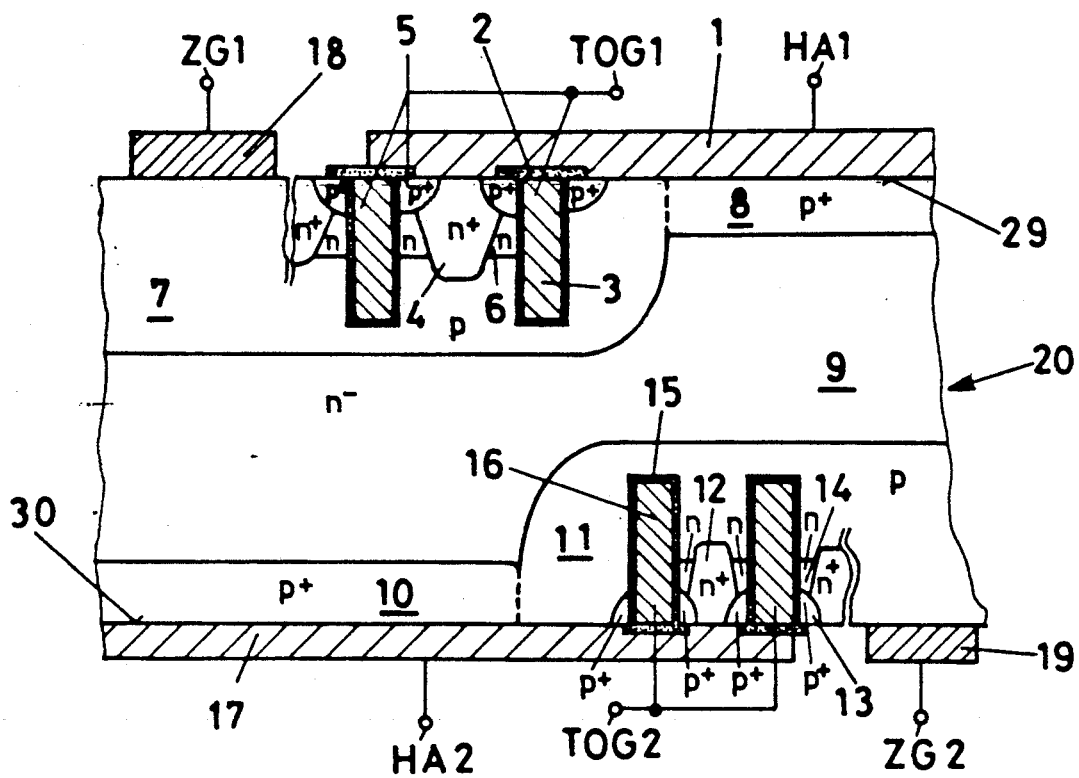
FIG. 3 shows an embodiment of the component alternative to FIG. 1 with vertical MOS gates.

An embodiment of a conventionally fired component according to the invention, which is an alternative to FIG. 1, is reproduced in FIG. 3. Here, vertical MOSFETs with vertically arranged gate electrodes (mostly made from Poly-Si) are used for the MOS-controlled short circuits.

Such vertical MOS structures provide advantages with respect to the channel resistance (the conducting p-channels in the n-channel regions 6 or 14) per unit of area. The smaller this resistance, the higher are the maximum current densities that can be turned off. Moreover, the packaging of such a component is facilitated, because, for example, the main electrodes 1 and 17 can be embodied in an entirely planar fashion.

Figure 4:
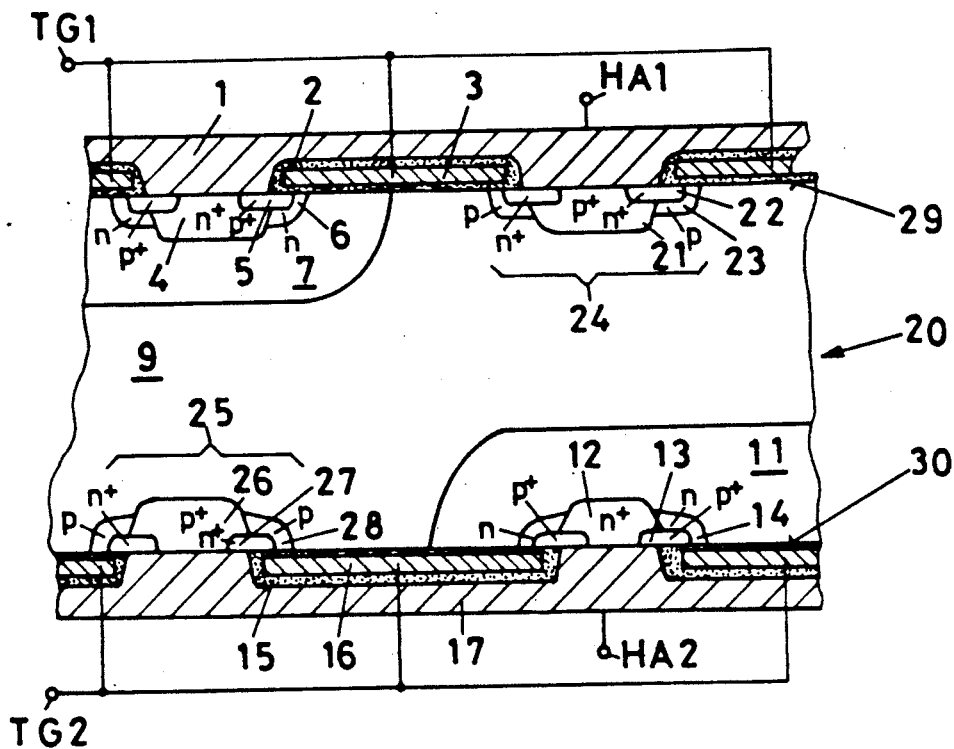
FIG. 4 shows a further illustrative embodiment for a component according to the invention with additional IGBT cells for the firing.

Another preferred embodiment of the component according to the invention is represented in FIG. 4. The n-base layer 9, the p-base layers 7 and 11 and the n-emitter regions 4 and 12 with their MOS-controlled short circuits are arranged here in a manner comparable to that in the component in accordance with FIG. 1.

Differences arise in the type of firing: whereas in the case of the component of FIGS. 1 or 3, firing is done conventionally via the usual firing gates ZG1 and ZG2, in the case of the component in accordance with FIG. 4, additional IGBT cells 24 or 25, which are controlled via the same gate electrodes 3 or 16 as the short circuits of the n-emitter regions 4 or 12, are provided for the purpose of firing in the regions in which the n-base layer 9 widens and comes to the surface. The gate electrodes 3 or 16 are connected to turn-on/off gates TG1 or TG2, which are responsible both for turning on and for turning off the component.

Each of the IGBT-cells 24 or 25 comprises a p⁺-doped p-emitter region 21 or 26, which is contacted by the respective main electrode 1 or 17, as well as MOS-controlled short circuits which consist of an n⁺-doped n-source region 22 or 27, a p-doped p-channel region 23 or 28, an n-base layer 9 and the widened gate electrodes 3 or 16.

By virtue of the double-sided combination of MCT and IGBT cells in one component, and of their being controlled via a MOS gate, the thyristor can be turned both on and off in both directions:

It is assumed for this purpose that the main electrode 1 is connected to ground as the cathode. The main electrode 2 correspondingly has a positive potential as the anode. The gate/anode voltage at the second turn-on/off gate TG2 amounts to 0 V, so that no inversion channels exist (either in the n-channel regions 14 or in the p-channel regions 28) on this (lower) side of the component. The same should also hold first for the other (upper) side of the component. Furthermore, it is assumed that in this operating mode the thyristor blocks.

By applying a positive gate/cathode voltage at the first turn-on/off gate TG1, the n-channels of the first IGBT cells 24 become conductive, and electrons pass into the n-base layer 9. Hereupon, the p-emitter regions 26 on the (lower) anode side begin to emit holes into these regions. The thyristor is fired in this way:

The turning off can be carried out in several ways:

In one type of turn-off, a negative potential can be applied at the gate of the cathode side (turn-on/off gate TG1), so that the p-channel in the n-channel regions 6 becomes conductive and the n-emitter region 4 is thus short circuited. The IGBT cells 24 on the side defined as cathode are not activated in the case of this negative potential. The regions in which the n-base layer 9 abuts on the cathode-side surface of the semiconductor substrate 20 are in the state of inversion in the case of the negative gate potential. The p-emitter regions 21 of the IGBT cells 24 and the p-base layer 7 are conductively connected by this p-conducting inversion layer, so that there are no high fields at the semiconductor substrate 20 - gate insulation 2 interface.

In a second type of turn-off, the thyristor can be turned off by turning on the anode-side short circuits (positive potential of the second turn-on/off gate TG2 with respect to the anode).

Anode and cathode short circuits can, of course, also be turned on simultaneously. Via the short circuits then activated, holes from the p-base layer 7 and electrons from the n-base layer 9 flow off until a space charge zone develops at the junction between the two layers. As soon as this zone has become sufficiently wide, holes which have still remained in the n-base layer 9 can be eliminated only via the mechanism of recombination. This causes slowly decaying tail currents, which contribute substantially to the turn-off loss.

In order to reduce the turn-off losses, it is advantageous to activate the anode short circuits (of the p-emitter regions 26) shortly before the cathode short circuits (of the n-emitter regions 4). During this brief period, which should be in the region of one to a few μsec, the hole injection is already interrupted, so that the whole concentration in the n-base layer 9 begins to drop. Electrons are still injected from the cathode, so that the ON-resistance is not yet substantially altered.

If the hole concentration in the n-base layer has become sufficiently small, the cathode short circuit can now be turned on. Once again, via the short circuits, holes from the p-base layer 7 and electrons from the n-base layer 9 can flow off until the space charge region is formed at the junction between these two layers.

The advantage by comparison with the case previously discussed now consists in that the hole density still remaining in the n-base layer 9 is substantially smaller. This has the effect of reducing the tail currents and thus the turn-off losses. Furthermore, the reduction of the hole density to the actual turn-off (time given by the turning on of the cathode short circuits) shifts the use of the "dynamic avalanche" to higher current densities.

Since the component in accordance with FIG. 4 is symmetrically constructed, the variants discussed above for the turn-off processes can be applied independently of the current direction obtaining at any one time (normal or inverse operation). Consequently, this component likewise has the static characteristic represented in FIG. 2.

Figure 5:
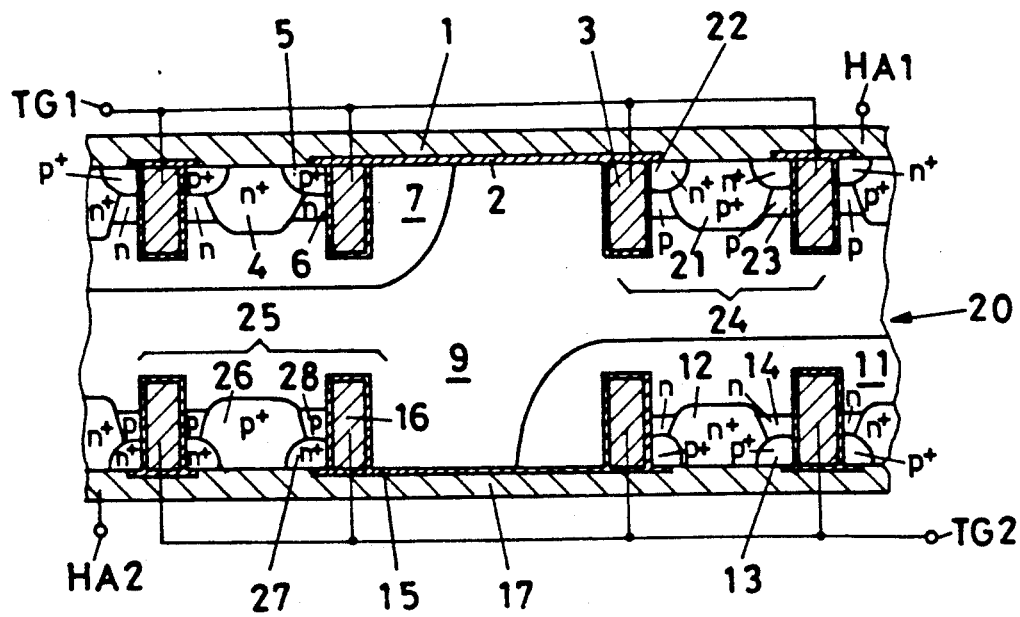
FIG. 5 shows an embodiment of the component alternative to FIG. 4 with vertical MOS gates.

Just as, in the case of the conventionally fired component of FIG. 1, the use of vertical MOS structures produces the component of FIG. 3, it is possible to specify, with respect to the component of the FIG. 4 with combined MCT and IGBT cells, an alternative with MOS structures, which is represented in FIG. 5.

Finally, a further useful aspect of the component in accordance with FIGS. 4 and 5 should be explained, in addition:

Let it be assumed here that the main electrode 1 is connected to ground as cathode, the main electrode 17 has a positive potential as anode, and the thyristor is operated conductively. If, in this situation, a short circuit occurs resulting in a voltage rise at the component, the anode current will rise until the component is thermally destroyed.

If, however, upon overshooting of a predetermined maximum current strength (an appropriate sensor can be integrated into the chip) both gates are connected to positive potential, the following situation arises: due to the short circuit of the anode, the thyristor tends to enter the off state. The injection of holes and electrones is exhausted within the p-n-p-n structure. However, electrons will now flow from the n-source regions 22 of the IGBT cells 24 to the anode short circuits which have been turned on. This unipolar flow of current corresponds to the operation of a power MOSFET. The bipolar current of the thyristor can thus be taken over as a unipolar current by the MOSFETs.

Figure 6:
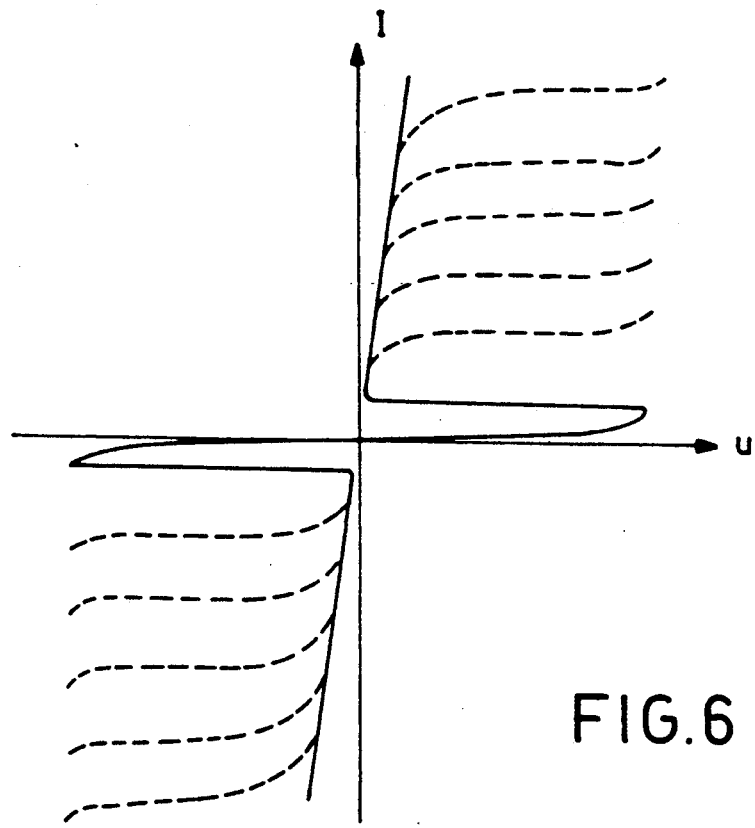
FIG. 6 shows the J-U-characteristic of a component in accordance with FIG. 4 (and FIG. 5) with current limiting.

Since, however, the MOSFET has a substantially higher ON-resistance, for the same current (the short circuit should, after all, be limited) the voltage increases across the component. This current limiting in the case of operation of the component as a MOSFET in the saturation region is desirable, and can protect the component from destruction. It is dependent upon the gate potential, and is plotted in the static characteristic of FIG. 6 as a dotted family of characteristics.

The following table, which specifies which operating state obtains for which gate potentials (0 V, positive or negative), can be drawn up for the control of the components in accordance with FIGS. 4 and 5.

TABLE

| Potential TG1 | Potential TG2 | Operating State |
|---|---|---|
| 0 | + | Turn-on inverse |
| + | 0 | Turn-on normal |
| 0 | 0 | On-state |
| 0 | − | Turn-off inverse |
| − | 0 | Turn-off normal |
| + | + | Saturate (IGBT-mode) |

Obviously, numerous modifications and variations of the present invention are possible in the light of the above teachings. It is therefore to be understood that within the scope of the appended claims, the invention may be practiced otherwise than as specifically described herein.

What is claimed as new and desired to be secured by Letters Patent of the United States is:

1. A bidirectional semiconductor component that can be turned off, comprising:

a semiconductor substrate bounded by first and second principal faces and divided laterally into a plurality of adjacent first and second regions, said semiconductor substrate including in its interior a first base layer of a first conductivity type which extends continuously through said first and second regions;

a first main electrode deposited on said first principal face and connected to a first main terminal;

a second main electrode deposited on said second principal face and connected to a second main terminal;

within each of said first regions a second base layer of a second conductivity type which is opposite to said first conductivity type, said second base layer projecting from said first principal face into said first base layer of said semiconductor substrate;

within each of said second regions a third base layer of said second conductivity type, said third base layer projecting from said second principal face into said first base layer of said semiconductor substrate;

within each of said first regions a first emitter region of said first conductivity type projecting from said first principal face into said second base layer and contacting said first main electrode;

within each of said second regions a second emitter region of said first conductivity type projecting from said second principal face into said third base layer and contacting said second main electrode;

within each of said first regions a third emitter region of said second conductivity type projecting towards said first principal face from said second principal face into said first base layer and being contacted by said second main electrode;

within each of said second regions a fourth emitter region of said second conductivity type projecting towards said second principal face from said first principal face into said first base layer and being contacted by said first main electrode;

along the periphery of each of said first emitter regions a first, MOS-controlled short for short circuiting said first emitter region, said first short comprising, a first source region of said second conductivity type which projects from said first principal face into said semiconductor substrate and is connected to said first main electrode, said second base layer, a first channel region of said first conductivity type which is arranged between said first source region and said second base layer, and a first gate electrode which is arranged above said first channel region and is isolated from said semiconductor substrate;

along the periphery of each of said second emitter regions a second, MOS-controlled short for short circuiting said second emitter region, said second short comprising, a second source region of said second conductivity type which projects from second principal face into said semiconductor substrate and is connected to said second main electrode, said third base layer, a second channel region of said first conductivity type which is arranged between said second source region and said third base layer, and a second gate electrode which is arranged above said second channel region and is isolated from said semiconductor substrate; and means for activating said semiconductor component.

2. The semiconductor component as claimed in claim 1, wherein said activating means comprises:

a first gate metallic coating provided on said first principal face beside said first main electrode and connected to a first firing activating gate contact, and contacting said second base layer; and a second gate metallic coating provided on said second principal face beside said second main electrode and connected to a second activating gate contact, and contacting said third base layer.

3. The semiconductor component as claimed in claim 1, wherein said activating means comprise:

along the periphery of each of said third emitter regions a third, MOS-controlled short for short circuiting said third emitter region, said third short comprising:

a third source region of said first conductivity type which projects from said second principal face into said semiconductor substrate and is connected to said second main electrode, said first base layer, a third channel region of said second conductivity type which is arranged between said third source region and said first base layer, and said second gate electrode which extends above said third channel region; and along the periphery of each of said fourth emitter regions a fourth, MOS-controlled short for short circuiting said fourth emitter region, said fourth short comprising:

a fourth source region of said first conductivity type which projects from said first principal face into said semiconductor substrate and is connected to said first main electrode, said first base layer, a fourth channel region of said second conductivity type which is arranged between said fourth source region and said first base layer, and said first gate electrode which extends above said fourth channel region.

4. The semiconductor component as claimed in one of the claims 1 to 3, wherein said first conductivity type is of the n-type and said second conductivity type is of the p-type.

5. The semiconductor component as claimed in claim 4, wherein said first base layer is $n^-$-doped, said second and third base layers are p-doped, said first and second emitter regions are $n^+$-doped, said third and fourth emitter regions and said first and second source regions are $p^+$-doped and said first and second channel regions are n-doped.

6. The semiconductor component as claimed in one of the claims 1 to 3, wherein said first and second gate electrodes project vertically into said semiconductor substrate.

* * * * *